(12) United States Patent
Yamashita

(10) Patent No.: US 6,326,630 B1
(45) Date of Patent: Dec. 4, 2001

(54) ION IMPLANTER

(75) Inventor: Yasuo Yamashita, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/184,335

(22) Filed: Nov. 2, 1998

(30) Foreign Application Priority Data

Nov. 6, 1997 (JP) .................................................. 9-304544

(51) Int. Cl.⁷ ........................ H01J 37/317; H01J 37/301
(52) U.S. Cl. ...................... 250/492.21; 250/492.2; 250/441.11; 250/398
(58) Field of Search ........................... 250/492.21, 492.2, 250/441.11, 398

(56) References Cited

U.S. PATENT DOCUMENTS

| | | | |
|---|---|---|---|
| 5,311,028 | * | 5/1994 | Glavish ............................ 250/492.21 |
| 5,389,793 | * | 2/1995 | Aitken et al. .................... 250/492.21 |
| 5,483,077 | * | 1/1996 | Glavish ............................. 250/492.2 |

FOREIGN PATENT DOCUMENTS

| | | |
|---|---|---|
| 0 225 717 | 6/1987 | (EP) . |
| 03 102755 | 4/1991 | (JP) . |
| 9-245705 | 9/1997 | (JP) . |
| 97 07525 | 2/1997 | (WO) . |

\* cited by examiner

*Primary Examiner*—Bruce Anderson
*Assistant Examiner*—Nikita Wells
(74) *Attorney, Agent, or Firm*—Mattingly, Stanger & Malur, P.C.

(57) ABSTRACT

In order to provide an ion implanter which can process the material in high accuracy by preventing charge up of the material, in an ion implanter comprising an ion source for generating an ion beam, a mass separator for separating and emitting only a necessary ion seed from said ion beam, a post acceleration tube for accelerating said ion bean emitted so as to have energy necessary for an ion implanting, a quadrupole lens department for shaping said accelerated ion beam to have a suitable shape for being implanted to, an ion deflection department for isolating and removing beam components being neutral electrically from said shaped ion beam, and an ion implanting room for implanting said ion to said material by implanting said ion beam that neutral beam components are removed, at least a post acceleration tube holds its high vacuum degree, and vacuum degree of the ion implanting room is held to generate a beam plasma.

2 Claims, 3 Drawing Sheets

ION IMPLANTER

BACKGROUND OF THE INVENTION

The present invention relates to an ion implanter, and especially relates to an ion implanter to implant a high-speed ion into a material to be processed such as a silicon wafer which is prevented from being charged up so as to be processed with high accuracy.

An example of a conventional ion implanter will be explained using FIG. 3 at first.

FIG. 3 is a sectional view showing total construction of the conventional ion implanter. To the ion beam drawn from an ion source 2 is applied a magnetic field in a mass separator 4 to change the direction thereof, so that only the ion species that should be implanted into a wafer 15 arrives at the wafer 15.

Therefore, ions which should not be implanted to the wafer 15, collide with a beam dump 5 or an isolation slit 6 arranged in the mass separator 4 so as to be removed.

The ion beam leaving the mass separator 4 is accelerated to have an energy necessary for being implanted by a post acceleration tube 7, and is introduced to a quadrupole lens section 8.

The beam entering the quadrupole lens section 8 is shaped to have a suitable beam shape for being implanted to the wafer 15.

The ion beam leaving the quadrupole lens section 8, is transmitted to an ion beam deflection section 13 for isolating and removing electrically neutral components after passing through an exit of the mass separator 4, and only the ion components are introduced to the ion implantion room 14 to be implanted to the wafer 15.

An electron gun 18 and a secondary electron supplying plate 19 to generate secondary electrons by the electrons emitted from the electron gun 18 are arranged between the ion beam deflection section 13 and the ion implanting room 14, and the generated secondary electrons are supplied to the wafer 15.

In this way, the wafer 15 is prevented from being charged up, and quality degradation of the wafer 15 caused by particles generated when being discharged or by destruction of the insulation film is prevented.

Recently, the ion implanter, and especially the electron supplying system thereof, has become large and complicated according to increasing of the beam current, and the measurement system for measuring quantity of the implanted ion has become complicated as well. As a result, the ion implanter has become more expensive.

Furthermore, in the ion implanter for producing SIMOX (Separation by IM plant ion Oxygen) substrate, as the temperature of the wafer needs to be kept high, there arises a problem that measurement of the quantity of the implanted ion becomes difficult when used the conventional device. For example, Japanese patent laid-open 9-245705(1997) discloses an example of a conventional ion implanter as stated above.

Moreover, in the ion implanter for large current, as the implanted ion beam current becomes large compared with the conventional device, the wafer implanted with the ions is charged up easily.

SUMMARY OF THE INVENTION

Referring to various problems of the conventional device as stated above, an object of the present invention is in providing an ion implanter in which charging up of the wafer is prevented effectively.

The present invention adopts the following means in order to solve the above problem.

In the ion implanter applying the present invention, a means for generating a beam plasma by an ion beam near the material to be processed such as a wafer being implanted by the ion, is provided.

Further, in an ion implanter having an ion source for generating the ion beam, a mass separator for separating and emitting only a necessary ion beam component from the ion beam, a post acceleration tube for accelerating the ion beam emitted from the mass separator so as to have energy necessary for the ion implanting, a quadrupole lens section for shaping the accelerated ion beam to have a suitable beam shape for being implanted to the wafer, an ion deflection section for isolating and removing electrically neutral beam components from the shaped ion beam, and an ion implanting room for implanting the ions to the processed material by implanting the ion beam for which neutral beam components have been removed, the post acceleration tube at least holds its degree of high vacuum, and the degree of vacuum of the ion implanting room is held to generate the beam plasma.

DETAILED DESCRIPTION OF THE PREFERRED EMBODIMENTS

The first embodiment of the present invention will be explained using FIG. 1 as follows.

Figure 1:
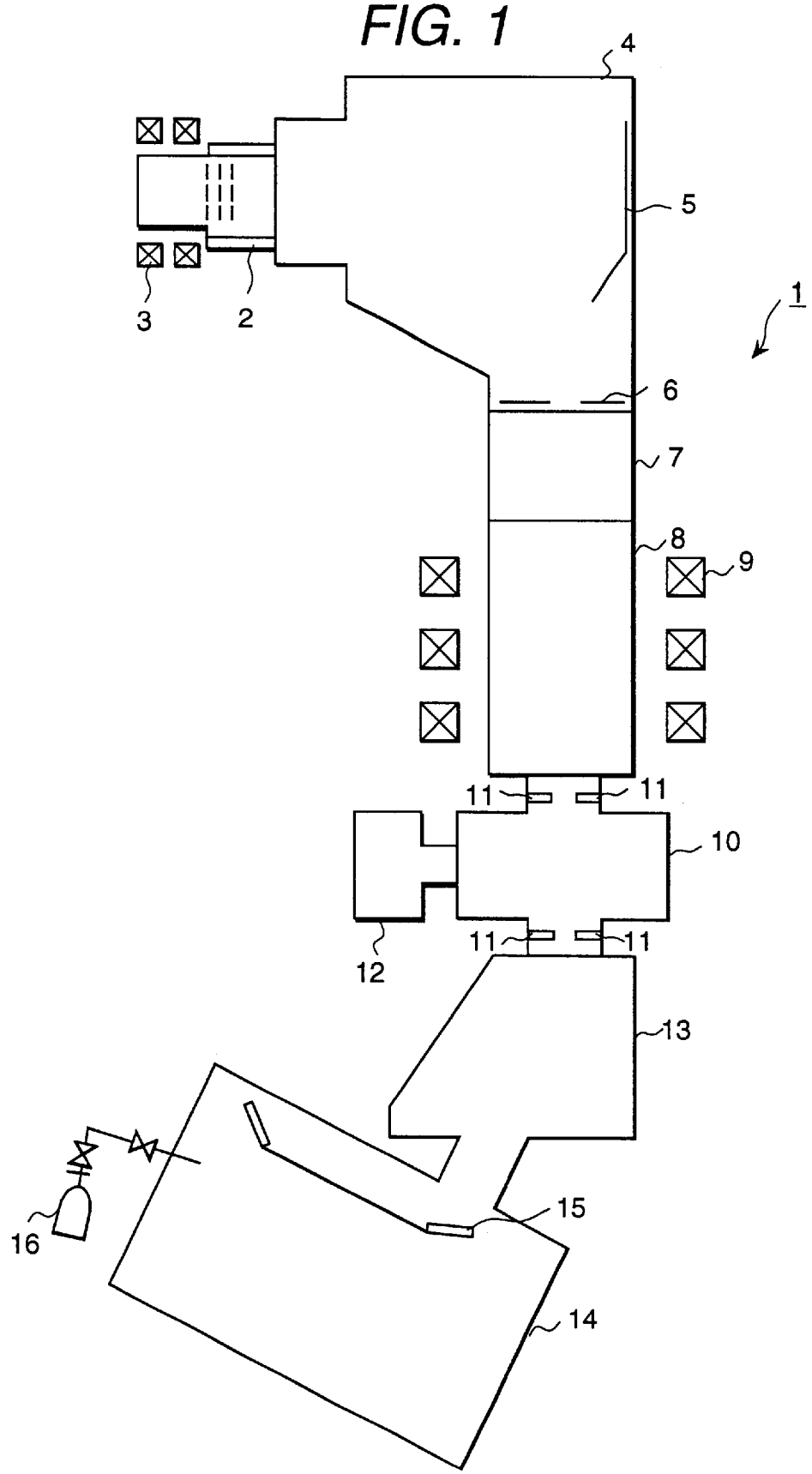
FIG. 1 is a total construction view of the ion implanter as a first embodiment of the present invention.

FIG. 1 is a total construction view of the ion implanter as a first embodiment of the present invention.

In FIG. 1, numeral 2 is an ion source for generating an ion beam and has an ion source electric coil 3, 4 a mass separator for changing a direction of the ion beam by a magnetic field which is not illustrated in the FIG. 5 a beam dump arranged in the mass separator 4 for removing unnecessary ions, 6 an isolation slit provided in an exit of the mass separator 4 for removing unnecessary ions, 7 a post acceleration tube for accelerating the introduced ions, 8 a quadrupole lens section for shaping the accelerated ion beam to have a suitable beam shape (cross-section being long in the vertical or in horizontal direction) for being implanted to the wafer 15, 9 a quadrupole magnet, 10 a vacuum expansion room, holding a high degree of vacuum so that discharge breakdown does not occur in the post acceleration tube 7, and forming a vacuum inclination to hold a degree of vacuum such that a beam plasma can be generated at a part of the wafer 15 near the ion implanting room 14, 11 a beam limiter for fixing the beam shape to an entrance of the vacuum expansion room 10 and making the electrical conductance of the vacuum large, 12 an exhaust pump for forming the vacuum gradient in the vacuum expansion room 10, 13 an ion beam deflection section for isolating and removing electrically neutral components after passing through an exit of the mass separator 4, 14 an ion implanting room in which ions are implanted, 15 a silicon wafer as a material to be processed arranged in the ion implanting room 14, and 16 a gas introduction device for controlling the degree of vacuum in the ion implanting room 14.

Though not illustrated in the figure, exhaust pumps to exhaust each partition to a high vacuum may be provided between the ion source 2 and the ion implanting room 14 as necessary.

In the embodiment described above, when the degree of vacuum of the ion implanting room 14 deteriorates to a level that the beam plasma may be generated, the degree of vacuum of the post acceleration tube section 7 deteriorates too, discharge breakdown occurs frequently, and it becomes impossible to accelerate the ion beam.

Therefore, the vacuum expansion room 10 is arranged so as to form a gradient (inclination) of the degree of vacuum between the post acceleration tube section 7 and the ion implanting room 14.

Moreover, in the vacuum expansion room 10, in order to form the gradient of the degree of vacuum mentioned above, the beam limiter 11 is arranged to decrease the conductance of the system.

Moreover, when the degree of vacuum of the ion implanting room 14 does not reach the level at which the beam plasma may be generated, the degree of vacuum may be controlled by the gas introduction device 16.

Here, the direction of the ion beam drawn from the ion source 2 is changed by applying a magnetic field in the mass separator 4, whereby only the ion beam component that should be implanted to the wafer 15 arrives at the wafer 15.

Ions except for the implanted ions are removed by colliding with the beam dump 4 or the isolation slit 5.

The ion beam that has left the mass separator 4 is accelerated to have an energy necessary for implanting the ion by the post acceleration tube 7. Furthermore, the ion beam is introduced in the quadrupole lens section 7, and shaped to have a beam form suited to be implanted by the quadrupole magnet 9.

In the ion beam that has left the quadrupole lens section 8, electrically neutral beam components remaining after passing the mass separator 7 are separated and removed at the beam deflection section 13, and only the ion components are introduced to the ion implanting room 14 and implanted to the wafer 15.

Prevention of the charging up in the ion implanter in this embodiment will be explained next.

When a beam having a high energy goes through the vacuum normally, if the degree of vacuum in the neighborhood of the beam is bad, the high energy beam collides with the gas in the beam neighborhood, and the gas in the beam neighborhood is changed to be plasma, whereby a beam plasma as a good conductor is formed.

In order to prevent the charge up by applying the principle stated above, in this embodiment, the vacuum expansion room 10 is arranged, the entry side of the vacuum expansion room 10 is held at a high vacuum, and the exit side of the vacuum expansion room 10 is held at a degree of vacuum at which a predetermined beam plasma may is generated.

As a result, the ion beam implanted in the wafer 15 in the ion implanting room 14 generates the beam plasma, this plasma serves as a road for discharging the electrons charged on the wafer 15, and the charge up is capable of being prevented by discharging the charge on the wafer 15.

According to the embodiment as stated above, as the vacuum expansion room 10 is arranged, a gradient of the degree of vacuum is formed between the post acceleration tube 7 and the ion implanting room 14, and the beam plasma is generated in the neighborhood of the wafer 15 of the ion implanting room 14, whereby the charge up of the wafer 15 may be prevented.

Therefore, quality degradation of a wafer due to generation of particles by discharging the wafer 15 and breakdown of the insulation film may be prevented.

On the other hand, the degree of vacuum of the post acceleration tube 7 may be held to be sufficiently higher than a level to produce the discharge breakdown, and normal ion implanting becomes possible.

Therefore in the present invention, it becomes possible to prevent the charge up of the wafer and to provide an ion implanter which is superior in reliability and production cost without adding any complicated electron gun or a measurement system therefor.

The second embodiment of the present invention will be explained using FIG. 2.

Figure 2:
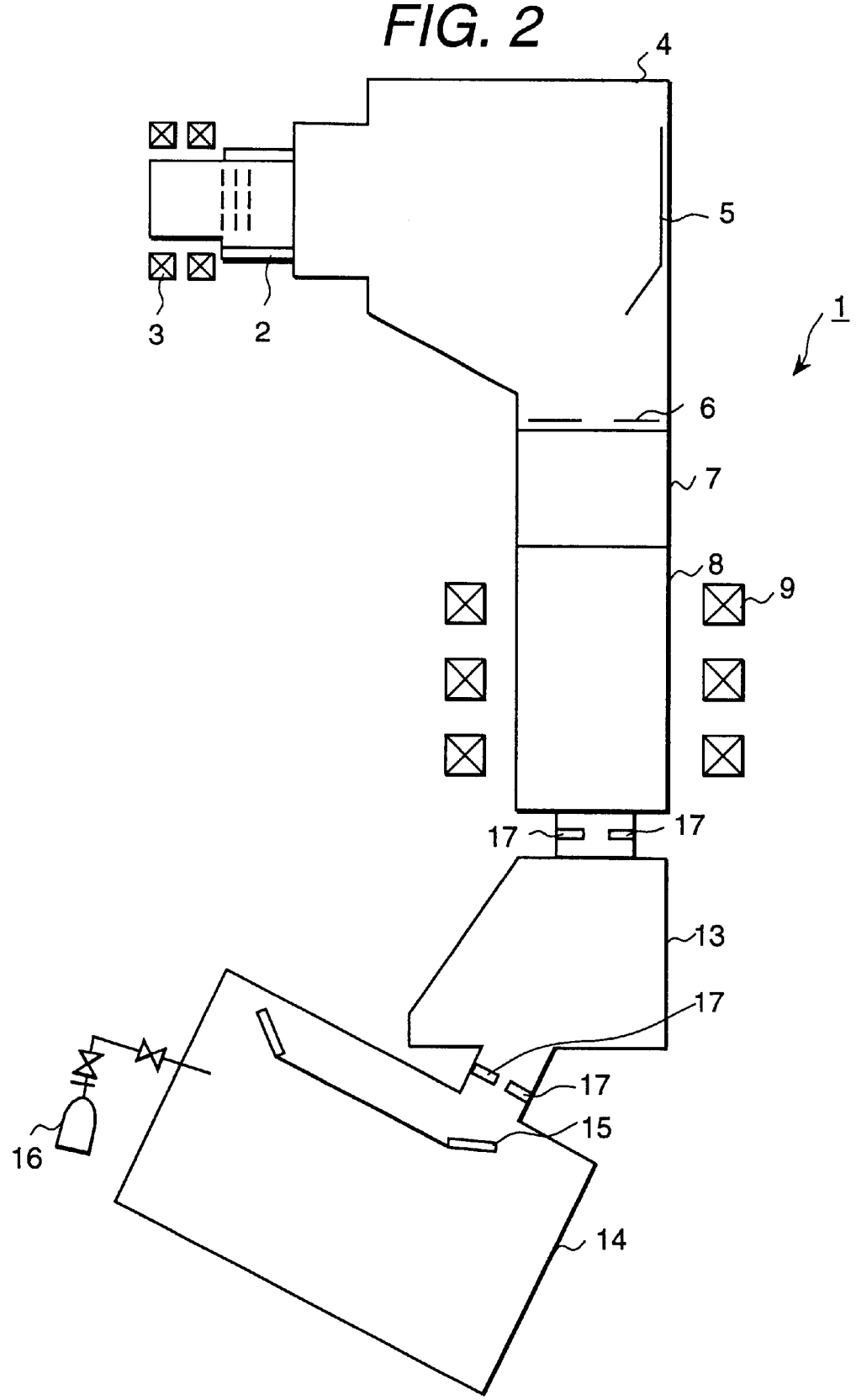
FIG. 2 is a total construction view of the ion implanter as a second embodiment of the present invention.
Figure 3:
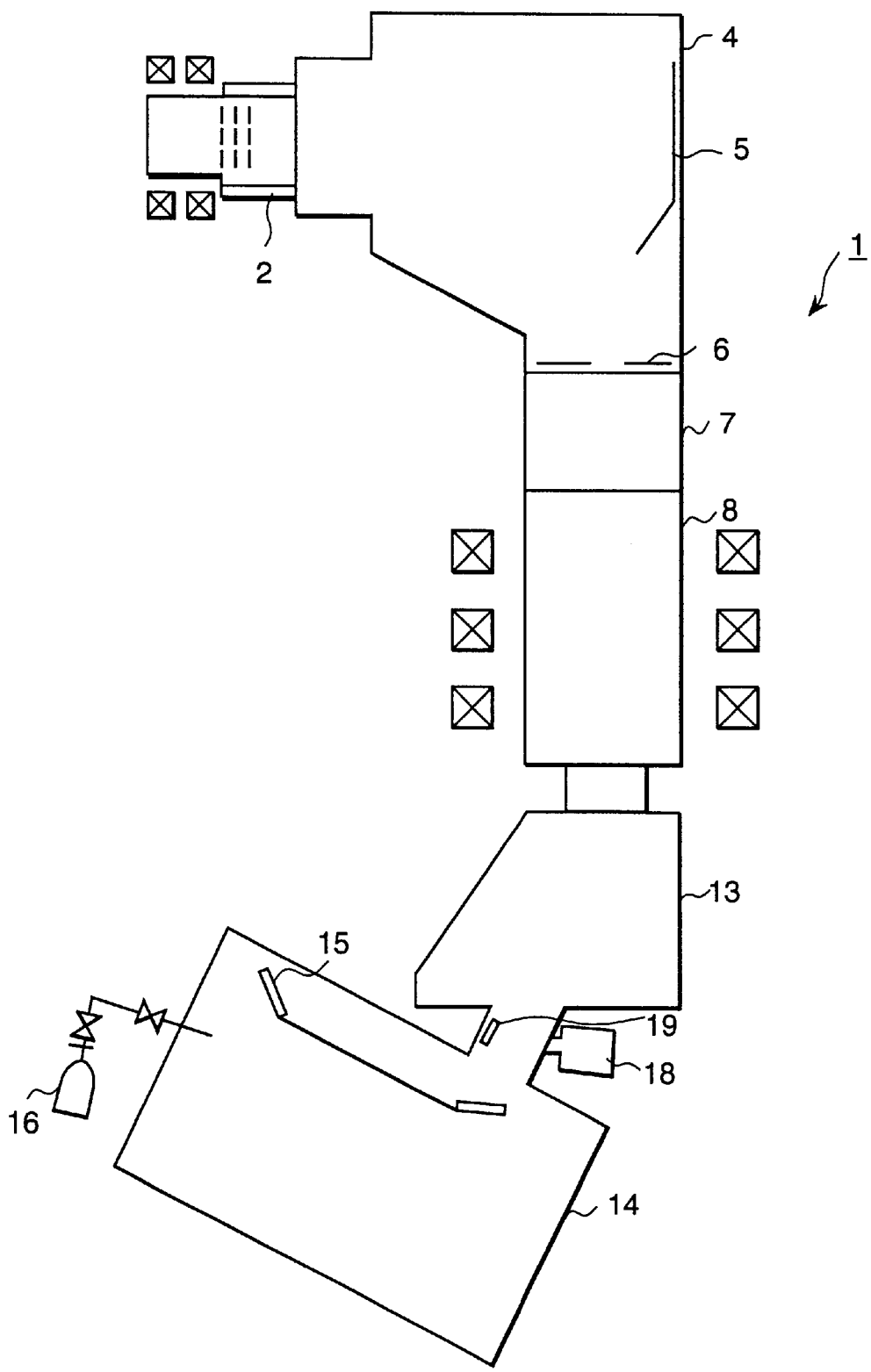
FIG. 3 is a total construction of an example of the conventional ion implanter.

FIG. 2 is a total construction view of the ion implanter as a second embodiment of the present invention.

In FIG. 2, numeral 17 is a beam limiter to be provided at an entrance of the beam deflection section 13 in order to arrange a beam shape or to make the electrical conductance of the vacuum larger.

In the first embodiment, the vacuum expansion room 10 is provided in order to form the gradient of the degree of vacuum; however, in this embodiment, the vacuum expansion room 10 having the beam limiter 11 is omitted, and the beam limiter 17 is arranged in an entrance or an exit of the beam deflection section 13.

The second embodiment is different from the first embodiment relating to this construction, and does not differ from the first embodiment otherwise.

In this embodiment, a vacuum pump (not shown in the figure) is provided on the beam deflection section 13 normally, and the gradient of the degree of vacuum is formed in the beam deflection section 13 in the same way as the vacuum expansion room 10 in the first embodiment by controlling the degree of vacuum using this vacuum pump, and controlling conductance of the vacuum using the beam limiter 17 provided in the entry and exit sections of the beam deflection section 13. Thus the beam plasma may be generated in the neighborhood of the wafer 15, and the charge up on the wafer 15 may be prevented.

In this embodiment as stated above, as the gradient of the degree of vacuum is formed by the beam limiter 17, etc., arranged to the entry and exit sections of the beam deflection section 13, the beam plasma is generated in the neighborhood of the wafer 15 in the ion implanting room 14, and a similar effect as in the first embodiment may be attained.

According to the ion implanter of the present invention as stated above, as the beam plasma is generated in the neighborhood of the material to be processed, the charge up of the material may be prevented, and quality degradation of a wafer due to generation of particles by discharging the material and breakdown of the insulation film may be prevented, and it becomes possible to provide the ion implanter which is superior in reliability and production cost.

What is claimed is:

1. An ion implanter comprising
   an ion source for generating an ion beam,
   a mass separator for separating and emitting only a necessary ion beam component from said ion beam,
   a post acceleration tube for accelerating said ion beam emitted so as to have energy necessary for an ion implanting,
   a quadrupole lens section for shaping said accelerated ion beam,
   an ion deflection section for isolating and removing beam components being neutral electrically from said shaped ion beam, an ion implanting chamber for implanting said ion beam to material, a vacuum expansion chamber provided between said post acceleration tube and said ion implanting chamber so that the vacuum degree of the ion implanting chamber is provided to be lower than that of the post acceleration tube so as to permit generation of a plasma in the ion implanting chamber, and a first beam limiter provided at an entry side of said vacuum expansion chamber and having a lower conductance than that of said post acceleration tube, and a second beam limiter provided at an exit of said vacuum expansion chamber and having a lower conductance than that of said vacuum expansion chamber, thereby creating a pressure gradient in the vacuum expansion chamber.

2. An ion implanter as defined in claim 1, wherein said first and second beam limiters shape the ion beam at said entry side and exit side, respectively.

* * * * *